(12) United States Patent
Knyazik et al.

(10) Patent No.: US 10,586,718 B2
(45) Date of Patent: Mar. 10, 2020

(54) COOLING BASE WITH SPIRAL CHANNELS FOR ESC

(71) Applicant: Applied Materials, Inc., Santa Clara, CA (US)

(72) Inventors: Vladimir Knyazik, Palo Alto, CA (US); Shahid Rauf, Pleasanton, CA (US); Stephen Prouty, San Jose, CA (US); Roland Smith, Sunnyvale, CA (US); Denis M. Koosau, Pleasanton, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 442 days.

(21) Appl. No.: 15/335,059

(22) Filed: Oct. 26, 2016

(65) Prior Publication Data

US 2017/0133244 A1 May 11, 2017

Related U.S. Application Data

(60) Provisional application No. 62/254,165, filed on Nov. 11, 2015.

(51) Int. Cl.
*H01L 21/67* (2006.01)
*F28F 3/12* (2006.01)
*F28D 7/04* (2006.01)
*F28D 1/047* (2006.01)

(52) U.S. Cl.
CPC .......... *H01L 21/67103* (2013.01); *F28D 7/04* (2013.01); *F28F 3/12* (2013.01); *F28D 1/0472* (2013.01); *F28F 2210/02* (2013.01)

(58) Field of Classification Search
CPC .......... H01L 21/67103; H01L 21/67109; F28F 3/12; F28F 2210/02; F28D 1/0473; F28D 7/04
See application file for complete search history.

(56) References Cited

U.S. PATENT DOCUMENTS

| 4,631,106 | A | * | 12/1986 | Nakazato | H01J 37/32623 204/298.07 |
|---|---|---|---|---|---|
| 5,192,849 | A | * | 3/1993 | Moslehi | H01J 37/32082 156/345.51 |
| 6,031,211 | A | * | 2/2000 | Mailho | C23C 16/46 219/121.4 |
| 6,129,046 | A | * | 10/2000 | Mizuno | C23C 16/45521 118/725 |
| 6,753,601 | B2 | * | 6/2004 | Hiramatsu | C04B 41/009 257/701 |
| 6,780,374 | B2 | * | 8/2004 | Weaver | H01L 21/67103 219/444.1 |
| 7,429,718 | B2 | | 9/2008 | Inagawa et al. | |
| 7,436,645 | B2 | * | 10/2008 | Holland | H01L 21/67103 361/230 |
| 8,512,509 | B2 | * | 8/2013 | Bera | H01J 37/321 118/715 |

(Continued)

*Primary Examiner* — Jon T. Schermerhorn, Jr.
(74) *Attorney, Agent, or Firm* — Patterson + Sheridan LLP

(57) ABSTRACT

Implementations described herein provide a cooling base and a substrate support assembly having the same. In one example, a cooling base is provided that includes a body coupled to a cap. A plurality cooling channels are disposed in the body and bounded on at least one side by the cap. The plurality cooling channels have a polar array of spirals.

18 Claims, 5 Drawing Sheets

(56) References Cited

U.S. PATENT DOCUMENTS

| | | | | |
|---|---|---|---|---|
| 8,955,579 B2* | 2/2015 | Tandou | ............... | F25B 39/02 |
| | | | | 118/724 |
| 2003/0164226 A1* | 9/2003 | Kanno | ............ | H01L 21/67109 |
| | | | | 156/345.51 |
| 2004/0061449 A1* | 4/2004 | Arai | ............ | H01J 37/32724 |
| | | | | 315/111.21 |
| 2007/0039942 A1* | 2/2007 | Leung | ............ | C23C 16/4586 |
| | | | | 219/443.1 |
| 2009/0159566 A1* | 6/2009 | Brillhart | ............ | C23C 14/505 |
| | | | | 216/58 |
| 2010/0193501 A1* | 8/2010 | Zucker | ............ | H01L 21/67248 |
| | | | | 219/443.1 |
| 2011/0180243 A1* | 7/2011 | Bera | ............ | F28F 3/12 |
| | | | | 165/168 |
| 2013/0284372 A1* | 10/2013 | Tavassoli | ............ | B01J 15/00 |
| | | | | 156/345.29 |
| 2013/0315795 A1* | 11/2013 | Bera | ............ | H01J 37/321 |
| | | | | 422/310 |
| 2014/0209596 A1 | 7/2014 | Lubomirsky et al. | | |
| 2015/0047975 A1* | 2/2015 | West | ............ | H01J 37/3405 |
| | | | | 204/298.07 |
| 2015/0364354 A1* | 12/2015 | Tantiwong | ....... | H01L 21/67109 |
| | | | | 156/345.34 |
| 2016/0169593 A1* | 6/2016 | Bera | ............ | F28F 3/12 |
| | | | | 165/80.1 |
| 2017/0010046 A1* | 1/2017 | Hofbauer | ............ | F28F 9/0246 |
| 2018/0142352 A1* | 5/2018 | Shah | ............ | C23C 16/505 |

* cited by examiner

COOLING BASE WITH SPIRAL CHANNELS FOR ESC

CROSS-REFERENCE TO RELATED APPLICATIONS

This application claims benefit of U.S. Provisional Application Ser. No. 62/254,165, filed Nov. 11, 2015, of which is incorporated by reference in its entirety.

BACKGROUND

Field

Implementations described herein generally relate to semiconductor manufacturing and more particularly to a substrate support assembly suitable for high temperature semiconductor manufacturing.

Description of the Related Art

Reliably producing nanometer and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and the quality of individual substrates.

To drive down manufacturing cost, integrated chip (IC) manufactures demand higher throughput and better device yield and performance from every silicon substrate processed. Improving temperature uniformity of electrostatic chucks has been identified as one area that can improve device yield. Conventional electrostatic chucks are typically bonded to a cooling plate in the substrate support assembly. The conventional electrostatic chucks utilize a plurality of heaters along with the cooling plate to maintain temperature control along the surface of the silicon substrate during processing. However, conventional cooling bases do not always have rotational or azimuthal temperature symmetry. Currently cooling bases flow cooling liquid through plenums which cannot not always prevent higher temperatures in certain areas due to heat flux from chuck heaters and the plasma formed in the chamber. Additionally, local cold spots are often associated with portions of the cooling base through which lift pins, thermocouples, power lines and He supply lines are present. The non-uniformity of temperatures across the substrate support skews the processing results for the substrates undergoing processing thereon. Thus, correcting the non-uniformity of the substrate support temperature lowers throughput and decreases device yield and performance for the processing chambers.

Thus, there is a need for an improved substrate support assembly.

SUMMARY

Implementations described herein provide a substrate support assembly having a cooling base that promotes azimuthal temperature symmetry. In one embodiment, the cooling base has a body and a cap. The body has and outer periphery, a top surface and a lower surface. The cap is disposed against the lower surface. The body additionally has an inner ring-shaped channel, an outer ring-shaped channel and a plurality channels disposed in the body. At least a portion of the channels is in contact with the cap and is formed in a polar array of spirals. Each channel has an inlet and an outlet and a plurality of segments extending from the inlet to the inner ring-shaped channel and out to the outer ring-shaped channel, and back towards the inner ring-shaped channel to the outlet. The segments of the channel are configured for flowing a fluid therethrough.

In another implementation, the substrate support assembly includes an electrostatic chuck secured to a cooling base. The cooling base has an outer periphery and a center portion and a cap. The cooling base has a body. The body has a top surface and a lower surface configured for the cap to fit thereon. The body additionally has an inner ring-shaped channel and an outer ring-shaped channel and a plurality channels disposed in the body. At least a portion of the channel is in contact with the cap and formed in a polar array of spirals. Each channel has an inlet and an outlet and a plurality of segments extending from the inlet to the inner ring-shaped channel and out to the outer ring-shaped channel, and back towards the inner ring-shaped channel to the outlet. The segments of the channel are configured for flowing a fluid therethrough.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide a substrate support assembly which enhances temperature uniformity during operation. The substrate support assembly has a substrate support bonded to a cooling base. The cooling base has spiral channels which improves azimuthal temperature uniformity on a substrate processed on the substrate support assembly. Temperature uniformity can be achieved by locally increasing the thermal resistance provided by a circular compensation channel disposed within the cooling base. As the cooling base has a high heat exchange coefficient, a wider process window for accommodating a high plasma heat load is realized.

Figure 1:
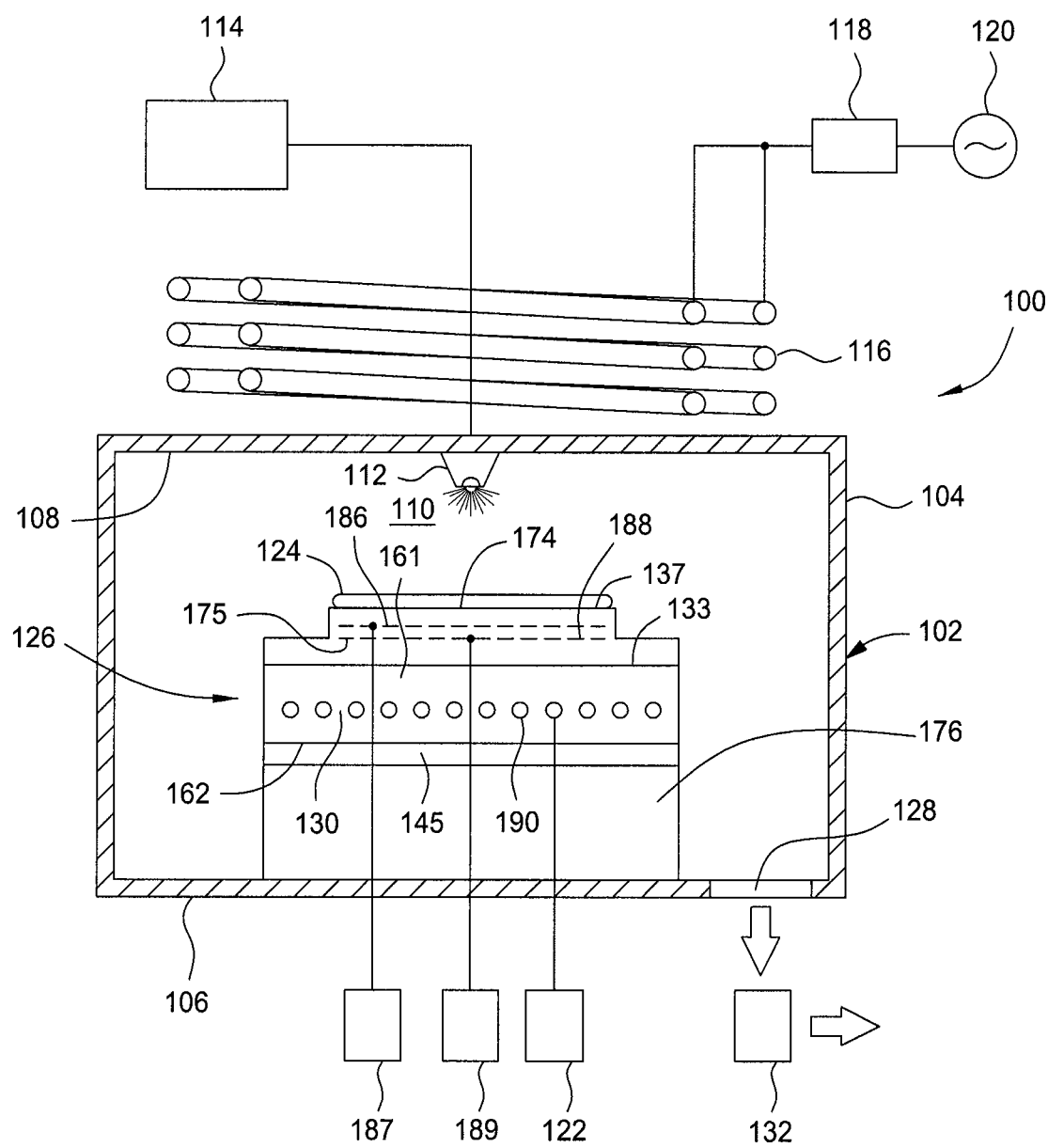
FIG. 1 is a cross-sectional schematic side view of a processing chamber having one embodiment of a substrate support assembly.

FIG. 1 is a cross-sectional schematic view of an exemplary plasma processing chamber 100, shown configured as an etch chamber, having a substrate support assembly 126. The substrate support assembly 126 may be utilized in other types of processing plasma chambers, for example plasma treatment chambers, annealing chambers, physical vapor deposition chambers, chemical vapor deposition chambers, and ion implantation chambers, among others, as well as other systems where the ability to control processing uniformity across a surface or workpiece, such as a substrate, is desirable.

The plasma processing chamber 100 includes a chamber body 102 having sidewalls 104, a bottom 106 and a lid 108 that enclose a processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzle or inlet ports, or alternatively a showerhead. Processing gas, along with any processing by-products, are removed from the processing region 110 through an exhaust port 128 formed in the sidewalls 104 or bottom 106 of the chamber body 102. The exhaust port 128 is coupled to a pumping system 132, which includes throttle valves and pumps utilized to control the vacuum levels within the processing region 110.

The processing gas may be energized to form plasma within the processing region 110. The processing gas may be energized by capacitively or inductively coupling RF power to the processing gases. In the embodiment depicted in FIG. 1, a plurality of coils 116 are disposed above the lid 108 of the plasma processing chamber 100 and coupled through a matching circuit 118 to an RF power source 120 for inductively coupling the RF power to the processing gas.

The substrate support assembly 126 is disposed in the processing region 110 below the injection apparatus 112. The substrate support assembly 126 may include a substrate support 174, a cooling base 130, a facility plate 145, and a base plate 176. The base plate 176 is supported by one of the sidewalls 104 or bottom 106 of the processing chamber. The substrate support assembly 126 may additionally include a heater assembly (not shown). Additionally, the substrate support assembly 126 may include an insulator plate (not shown) disposed between the cooling base 130 and the base plate 176.

The substrate support 174 may be a heater, electrostatic chuck or other suitable device for supporting the substrate 124 during processing in the plasma processing chamber 100. The substrate support 174 has a dielectric body 175. The dielectric body 175 has a workpiece support surface 137 and a bottom surface 133 opposite the workpiece support surface 137. The workpiece support surface 137 may include gas passages (not shown) for providing backside heat transfer gas to the interstitial space defined between the substrate 124 and the workpiece support surface 137 of the substrate support 174. The substrate support 174 may also include lift pin holes for accommodating lift pins (not shown) for elevating the substrate 124 above the workpiece support surface 137 to facilitate robotic transfer into and out of the plasma processing chamber 100.

The substrate support 174, when configured as an electrostatic chuck, may include a chucking electrode 186 embedded in the dielectric body 175. The chucking electrode 186 may be configured as a mono polar or bipolar electrode, or other suitable arrangement. The chucking electrode 186 is coupled through an RF filter to a chucking power source 187, which provides a RF or DC power to electrostatically secure the substrate 124 to the workpiece support surface 137 of the substrate support 174.

The dielectric body 175 may also include one or more resistive heaters 188 embedded therein. The resistive heaters 188 may be provided to elevate the temperature of the workpiece support surface 137 to a temperature suitable for processing a substrate 124 disposed thereon. The resistive heaters 188 are coupled through the facility plate 145 to a heater power source 189 for energizing and controlling the resistive heaters 188.

The cooling base 130 is supported by the base plate 176. The cooling base 130 may include cooling features 190 formed therein. The cooling features 190 may be connected to a heat transfer fluid source 122. The heat transfer fluid source 122 provides a heat transfer fluid, such as a liquid, gas or combination thereof, which is circulated through one or more cooling features 190 disposed in the cooling base 130. In one embodiment, the fluid source 122 may provide about 4 gallons per minute of GALDEN® cooling fluid at about 40 degrees Celsius. The fluid flowing through neighboring cooling features 190 may be isolated to enabling local control of the heat transfer between the substrate support 174 and different regions of the cooling base 130, which assists in controlling the lateral temperature profile of the substrate 124. In one embodiment, the heat transfer fluid circulating through the cooling features 190 of the cooling base 130 maintains the cooling base 130 at a temperature between about 90 degrees Celsius and about 80 degrees Celsius or at a temperature lower than 90 degrees Celsius.

The cooling base 130 may have an upper surface 161 and a lower surface 162. The substrate support 174 may be disposed on the upper surface 161 of the cooling base 130. The cooling base 130 may be bonded to the substrate support 174 by an adhesive layer. The adhesive layer may have a thermal conductivity between about 0.1 W/mK and about 1 W/mk, such as about 0.17 W/mK. A plurality of fluid passages may be formed in the upper surface 161 of the cooling base 130 for regulating the temperature between the substrate support 174 and the cooling base 130. The lower surface 162 of the cooling base 130 may be disposed on the facility plate 145, heater, or base plate 176.

Figure 2:
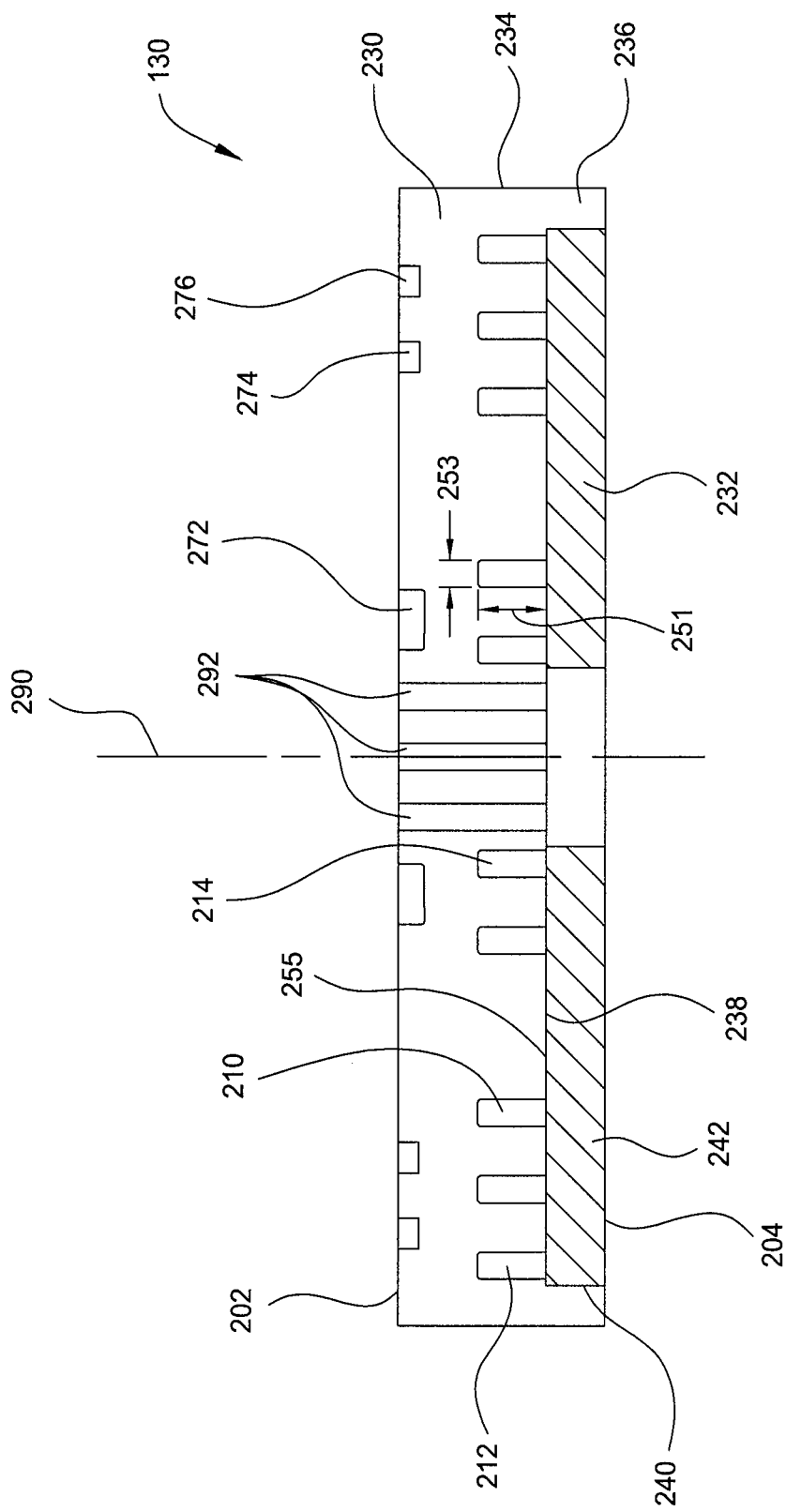
FIG. 2 is a cross-sectional schematic side view of a cooling base for the substrate support assembly.

FIG. 2 is a partial cross-sectional schematic side view of the cooling base 130 of the substrate support assembly 126. The cooling base 130 has a top surface 202, a bottom surface 204 and an outer periphery 234. The top surface 202 is disposed below the substrate support 174. The bottom surface 204 is disposed above the facility plate 145 of the substrate support assembly 126. The cooling base 130 has a plurality of cooling features 190, such as a plurality of cooling channels 210.

A plurality of passageways 292 may be formed proximate a center 290 of the cooling base 130. The passageways 292 may provide access through the cooling base 130 for electrical connections to the substrate support 174 disposed above the top surface 202 of the cooling base 130. For example, electrical connections to the resistive heaters 188 may traverse through the passageways 292 to the heater power source 189. Similarly, the chucking power source 187 may traverse through the passageways 292 to the substrate support 174.

The cooling base 130 has a body 230. The cooling base 130 may additionally have a cap 232. In one embodiment, the body 230 is configured to mate with the cap 232 to enclose the cooling channels 210. As such, the some or all of the plurality of cooling channels 210 may be formed in one or both of the cap 232 and body 230. In another embodiment, the body 230 and cap 232 are a single unitary piece formed together, such as through additive manufacturing. The body 230 and the cap 232 may be formed from a metal or ceramic such as aluminum (Al), aluminum nitride (AlN), aluminum oxide (AlO), yttria, or other suitable material. The body 230 may be machined from a block of material, such as AlN, or formed by an additive manufacturing technique such as 3D printing.

The body 230 may have a lower surface 238. The cap 232 is disposed on the lower surface 238. The cap 232 may be attached to the lower surface by any suitable method including welding or gluing. The cap 232 forms the bottom surface 204 of the cooling base 130. The body may optionally have a ring-like tab 236 extending along the outer periphery 234 of the cooling base 130. The ring-like tab 236 has an inner diameter 240 defining an inner cavity 242. The inner cavity 242 is configured to accept the cap 232 therein. The cap 232 may contact the body 230 along the inner diameter 240 of the tab and the lower surface 238 of the body. The cap 232 may be attached to the inner cavity 242 by any suitable method. For example, the cap 232 may be welded, adhered, press fit, or attached by other suitable methods to the inner cavity. When disposed in the inner cavity 242 and in contact with the lower surface 238, the cap 232 and the ring-like tab 236 are substantially planar and form the bottom surface 204 of the cooling base 130.

The thermal compensation channel 272 may be formed in the cooling base 130 proximate the center 290. The thermal compensation channel 272 may be milled, etched, 3D printed, or formed by other suitable manufacturing methods in of the cooling base 130. The thermal compensation channel 272 may increase the thermal resistance in the cooling base 130 proximate the center 290.

The gas distribution channels 276, 274 may be formed in the cooling base 130 near the outer periphery 234. The gas distribution channels 276, 274 may be milled, etched, 3D printed, or formed by other suitable manufacturing methods the cooling base 130. The gas distribution channels 276, 274 are configured to flow a backside gas therethrough. In one embodiment, the gas distribution channels 276, 274 have helium flowing therethrough. The gas distribution channels 276 and 274 along with the thermal compensation channel 272 are discussed further below in FIG. 5.

The plurality of cooling channels 210 may be formed in the lower surface 238 of the body 230. The cooling channels 210 may be milled, etched, cast, 3D printed or formed by other suitable methods. In one embodiment, the cooling channels 210 are milled into the body 230. The cooling channels 210 are configured to transport a cooling fluid therethrough. The cooling fluid regulates the temperature of the cooling base 130. The cooling channels 210 may have a polar array of spirals and extend between an inner ring-shaped channel 214 and an outer ring-shaped channel 212. The cooling channels 210 may have a width 253 and a depth 251. The depth 251 and width 253 of the cooling channels 210 may be suitably configured to flow a desired volume of cooling fluid through each cooling channels 210.

The cap 232 may be secured to the body 230 for sealing a portion of the cooling channels 210 exposed along the lower surface 238 of the body 230. The cap 232 may be attached to the body 230 with an adhesive, weld, press fit, or attached by other suitable techniques. Alternately, the cap 232 and the body 230 may be formed integral to one another through an additive manufacturing process such as 3D printing. In one embodiment, the body 230 and cap 232 may be e-beam welded together. A gap 255 may form between the body 230 and the cap 232. The gap 225 is selected to allow an acceptable level of fluid cross-talk (i.e., transfer or leakage) between adjacent cooling channels 210, if any. In one embodiment, the gap 255 may have a distance of about 0.001 inch.

The cooling base 130 has a polar array of 2N equally spaced cooling channels 210, where N is a positive integer. The cooling channels 210 may have a spiral shape for flowing a cooling liquid therethrough. The shape of the cooling channels 210 may be selected to follow the following criteria:

$$X=(r0+2N(theta/2pi)dr)*cos(theta0+theta)$$

$$Y=(r0+2N(theta/2pi)dr)*sin(theta0+theta)$$

The cooling channels 210 possess rotational symmetry with each other cooling channel 210 and have a constant pitch (dr). The number of cooling channels 210 can be made in multiples of 3 to simplify accommodating 3 lift pins between the cooling channels 210. Each cooling channel 210 is terminated by an inlet and an outlet hole, and splits into several parts (as described further below with reference to FIG. 3). The cooling channels 210 may be connected together by concentric circular channels close to the center by an inner ring-shaped channel 214 and at the edge of the cooling base 130 by outer ring-shaped channel 212. It is noted that a portion of each cooling channel 210 includes portions of the inner ring-shaped channel 214 and the outer ring-shaped channel 212. In other embodiments, neighboring cooling channels 210 are not connected by the channels 212, 214.

To further improve radial temperature uniformity, at least one or more of a thermal compensation channel 272, and gas distribution channels 274, 276 may be formed in the cooling base 130 for balancing the reduced cooling efficiency near the center 290 caused by the cluster of connections in the passageways 292. The thermal compensation channels 272, and gas distribution channels 274, 276 may be positioned to locally improve the cooling efficiency at the boundaries of the heating zones in the substrate support 174, and reduces radial temperature gradients. Advantageously, the cooling channels 219 provide improved temperature uniformity and reduce the cost of the cooling base 130. Simulations have demonstrated improvements over conventional cooling bases for providing temperature uniformity on a substrate support 174 equipped with the cooling base 130. The cooling base 130 may also be used in any heated substrate support for providing temperature uniformity.

Figure 3:
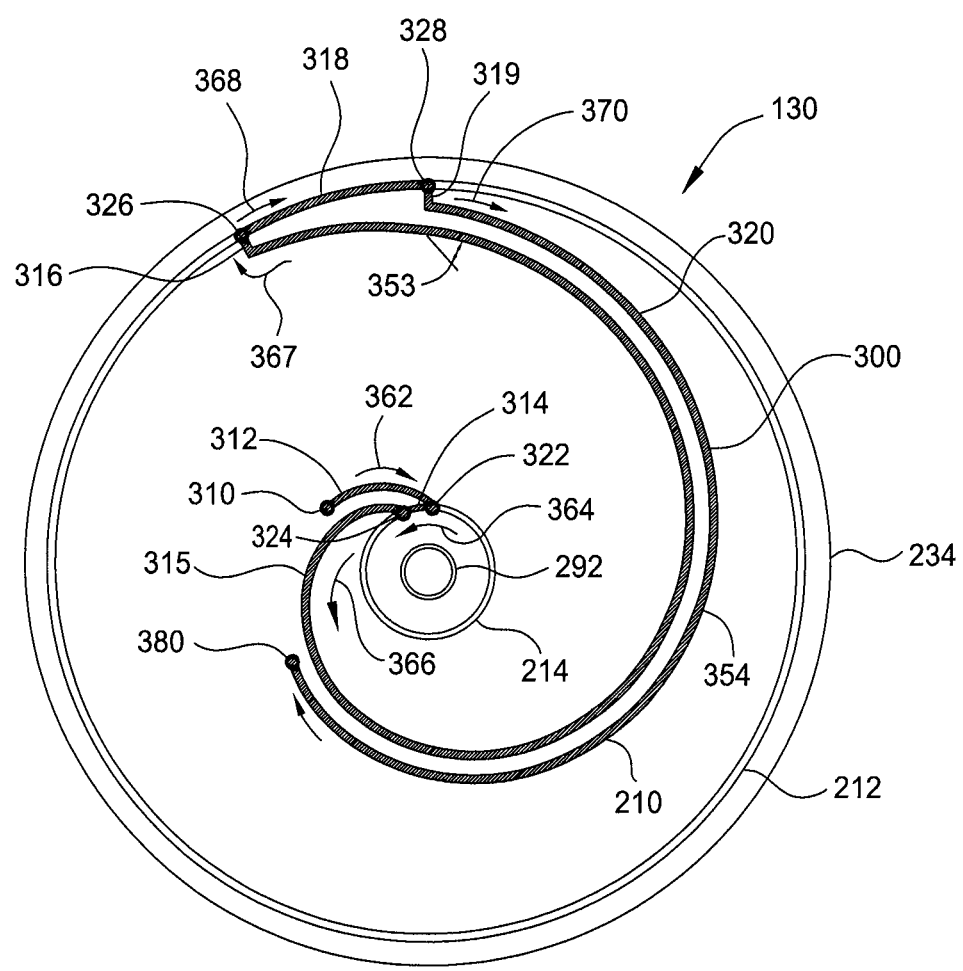
FIG. 3 is a bottom plan view of the cooling base having a cap removed to expose one of a plurality of cooling channels, the other cooling channels not shown to avoid drawing clutters and ease of description.

FIG. 3 is a bottom plan view of the cooling base 130 having the cap 232 removed to expose one of the plurality of cooling channels 210 disposed therein. The cooling channel 210 shown in FIG. 3 is hereinafter referred to as a first cooling channel 300. The other the cooling channels 210 have been omitted from FIG. 3 to provide greater clarity of the description of the first cooling channel 300 as shown. Fluid flows through the first cooling channel 300 to regulate the temperature of the cooling base 130. It should be appreciated that the features disclosed with respect to the discussion of the first cooling channel 300 may also be found on each of the other cooling channels 210. Thus, each cooling channel 210 is substantially similar to the first cooling channel 300 unless otherwise indicated.

The first cooling channel 300 may have an inlet 310 and an outlet 380. The inlet 310 is configured to provide a cooling fluid into the first cooling channel 300. The inlet 310 may be fluidly connected to an external cooling fluid source such as the heat transfer fluid source 122 depicted in FIG. 1. The cooling fluid through the first cooling channel 300 from the inlet 310 to the outlet 380. A temperature of the fluid may increase from the inlet 310 to the out 380 as heat is transferred to the cooling fluid from the cooling base 130. The outlet 380 receives the cooling fluid from the first cooling channel 300. The outlet 380 provides the cooling fluid back to the external cooling fluid source or to another suitable location for reuse or disposal. In one embodiment, a heat transfer fluid, for example a GALDEN® heat transfer fluid or other suitable fluid, provided from the heat transfer fluid source 122 enters the first cooling channel 300 at the inlet 310. The heat transfer fluid flows through the first cooling channel 300 to regulate the temperature of the cooling base 130. The heat transfer fluid exits the first cooling channel 300 at the outlet 380 and may be recirculated back to the heat transfer fluid source 122.

The first cooling channel 300 may have several distinct segments. Each of the segments may be for the cooling channel may be substantially fluid tight and a substantial portion of the cooling fluid entering one end of the segment leaves out the other end of the segment. Alternatively, as portion of the fluid in each segment may be exchanged with the fluid passing through the neighboring cooling channels 210. Each of the segments may be separated by a node. The nodes represent a beginning or ending of the segment and may or may not have actual structure. In the discussion which follows, the nodes are used to provide reference while discussing each of the segments of the first cooling channel 300. In one embodiment, the first cooling channel 300 may have five or more segments providing for fluid flow through first cooling channel 300 without substantial fluid loss. For example, the first cooling channel 300 may have a first segment 312 disposed between the inlet 310 and the inner ring-shaped channel 214. Cooling fluid entering the first cooling channel 300 from the inlet 310 may flow in a direction 362 toward the inner ring-shaped channel 214. The first segment 312 may have a curved shape, for example, a portion of a spiral.

A second segment 314 of the first cooling channel 300 may be attached to the first segment 312 at a first node 322. The second segment 314 may be formed from a portion of the inner ring-shaped channel 214 and span from the first node 322 to a second node 324. The second segment 314 may have a curved shape. Alternately, the second segment 314 may include the inner ring-shaped channel 214 in additional to that portion of the inner ring-shaped channel 214 between the first node 322 and a second node 324. For example, the second segment 314 of the first cooling channel 300 may include the entire inner ring-shaped channel 214 for fluidly coupling the first node 322 to the second node 324. Fluid flowing into the second segment 314 from the first node 322 may flow in a counterclockwise direction 364 (shown by the arrow) toward the second node 324. The nodes 322, 324 may form discrete fluid stops in the inner ring-shaped channel 214 such that fluid entering the inner ring-shaped channel 214 from the first cooling channel 300 cannot flow entirely around the entire inner ring-shaped channel 214 and only between the nodes 322, 324. Alternately, the nodes 322, 324 may merely be junctions connecting the segments, such as the first segment 312 to the inner ring-shaped channel 214. Portions of the fluid flowing into the inner ring-shaped channel 214 from the first cooling channel 300 may therefore flow along the inner ring-shaped channel 214 past the node 324 or in an opposite direction of node 324. In one embodiment, all the cooling fluid entering the inner ring-shaped channel 214 at node 322 from the first cooling channel 300 leaves the inner ring-shaped channel 214 at node 324. In another embodiment, a portion of the cooling fluid from the first cooling channel 300 entering the inner ring-shaped channel 215 at node 322 may leave the inner ring-shaped channel 214 in one of the cooling channels 210 different than the first cooling channel 300. The velocity of the cooling fluid in the second segment 314 may be less than the velocity of the cooling fluid in the first segment 312 when only a portion of the cooling fluid from the entering at node 422 exits at node 324.

A third segment 315 of the first cooling channel 300 may be attached to the second segment 314 at the second node 324. The third segment 315 may have a curved shape, for example, a portion of a spiral. Cooling fluid entering the third segment 315 from the second segment 314 may flow in a direction 366 (shown by the arrow) outward toward the outer ring-shaped channel 212. The third segment 315 may have a perpendicular portion 316 at a third node 326 on the outer ring-shaped channel 212. The perpendicular portion 316 un-biases the flow direction of the cooling fluid when the cooling fluid enters the outer ring-shaped channel 212. For example, in a scenario where the third segment 315 does not have the perpendicular portion 316, flow from the third segment 315 entering the outer ring-shaped channel 212 would tend to continue in substantially the same direction as the fluid is flowing when the fluid enters the outer ring-shaped channel 212, here shown in a clockwise direction 368 although a counterclockwise direction may equally have been plausible. The velocity of the cooling fluid in the second segment 314 may be less than the velocity of the cooling fluid in the third segment 315 when the fluid is permitted to flow in both the clockwise direction 368 and counter clockwise direction.

A fourth segment 318 of the first cooling channel 300 may be attached to the third segment 315 at the third node 326. The fourth segment 318 may have a curved shape. The fourth segment 318 may be formed from a portion of the outer ring-shaped channel 212 and span from the third node 326 to a fourth node 328. Alternately, the fourth segment 318 may include the outer ring-shaped channel 212 in addition to that portion of the outer ring-shaped channel 212 between the third node 326 and the fourth node 328. The third node 326 may form a discrete fluid stop in the outer ring-shaped channel 212 such that fluid entering the outer ring-shaped channel 212 from the first cooling channel 300 flows only in a clockwise direction 368 around the outer ring-shaped channel 212 and exits at the next node, i.e., the fourth node 328. Alternately, the nodes 326, 328 may merely connect the segments of the first cooling channel 300 to the outer ring-shaped channel 212 and allow flow in either direction in the outer ring-shaped channel 212. Portions of the fluid flowing into the outer ring-shaped channel 212 from the node 326 may flow past the fourth node 328 or in an opposite direction of the fourth node 328. In one embodiment, all the cooling fluid entering the outer ring-shaped channel 212 at the third node 326 leaves the outer ring-shaped channel 212 at the fourth node 328. In another embodiment, a portion of the cooling fluid from the first cooling channel 300 entering the outer ring-shaped channel 212 at the third node 326 may leave the outer ring-shaped channel 212 in one of the cooling channels 210 different than the first cooling channel 300. The velocity of the cooling fluid in the fourth segment 318 may be less than the velocity of the cooling fluid in the third segment 315 when only a portion of the cooling fluid from node 326 exits at the node 324.

A fifth segment 320 of the first cooling channel 300 may be fluidly connected to the fourth segment 318 at the fourth node 328. The fifth segment 320 may have a curved shape, such as a portion of a spiral. Similar to the perpendicular 316 in the third segment 315 at the third node 326, a perpendicular portion 319 of the fifth segment extends from the outer ring-shaped channel 212. Fluid entering into the fifth segment 320 flows in a direction 370 toward the outlet 380. The velocity of the cooling fluid in the fourth segment 318 may be less than the velocity of the cooling fluid in the fifth segment 320 when only a portion of the cooling fluid from node 326 exits at the node 324.

The first cooling channel 300 may have a generally spiral geometry winding around the inner ring-shaped channel 214 at the center of the cooling base 130 with individual segments getting progressively further or closer away from the inner ring-shaped channel 214 as the first cooling channel 300 revolves around the inner ring-shaped channel 214. For example, the first segment 312 of the first cooling channel 300 may spiral inward to the inner ring-shaped channel 214. The third segment 315 of the first cooling channel 300 may spiral outward from the inner ring-shaped channel 214 to the outer ring-shaped channel 212. The fifth segment 320 of the first cooling channel may finally spiral inward from the outer ring-shaped channel 212 to the outlet 380. The spiral for the first, third and fifth segments 312, 315, 320 may have a substantially similar pitch.

Figure 4:
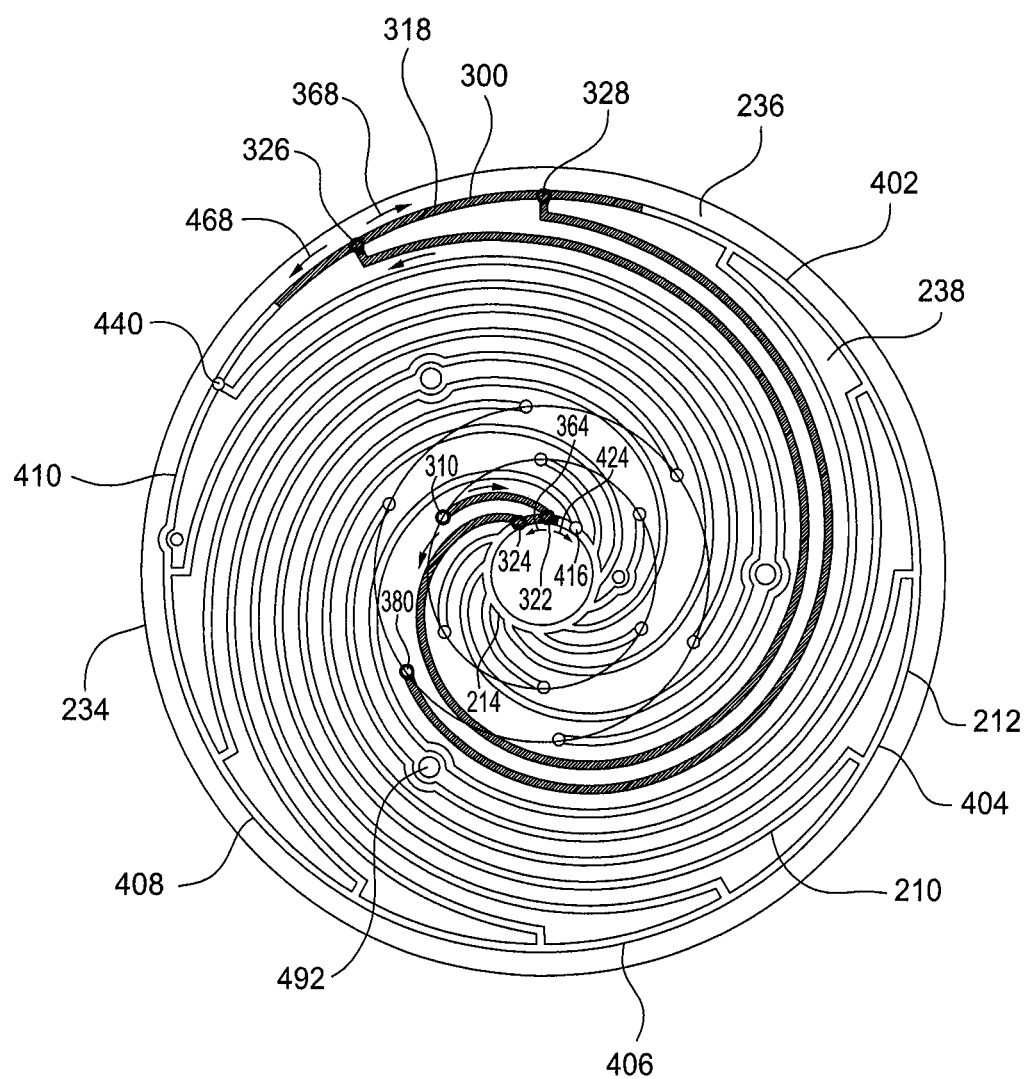
FIG. 4 is another bottom plan view of the cooling base having the cap removed exposing all the cooling channels.

FIG. 4 is another bottom plan view of the cooling base 130 having the cap removed exposing the cooling channels 210 disposed therein. In one embodiment, the cooling base 130 has at least six cooling channels 210. For example, the cooling base 130 may have a second cooling channel 402 and a sixth cooling channel 410 adjacent to the first cooling channel 300. The cooling base 130 may additionally have a third cooling channel 404, a fourth cooling channel 406 and a fifth cooling channel 408 disposed between the second cooling channel 402 and the sixth cooling channel 410. The second, third, fourth, fifth, and sixth cooling channels 402, 404, 406, 408, 410 may be substantially similar to the first cooling channel 300 discussed above. In one embodiment, the first, second, third, fourth, fifth, and sixth cooling channels 300, 402, 404, 406, 408, 410 are substantially fluidly isolated from each other. In another embodiment, the first, second, third, fourth, fifth, and sixth cooling channels 300, 402, 404, 406, 408, 410 may be fluidly coupled at the inner ring-shaped channel 214 or the outer ring-shaped channel 212. In yet another embodiment, the first, second, third, fourth, fifth, and sixth cooling channels 300, 402, 404, 406, 408, 410 are fluidly coupled at both the inner ring-shaped channel 214 and the outer ring-shaped channel 212.

In one example, the cooling fluid is flown through the first cooling channel 300 to regulate the temperature of the cooling base 130. Substantially all the fluid flowing in through the inlet 310 into the first cooling channel 300 flows out the outlet 380. In another example, the fluid flowing in from the inlet 310 and through the first cooling channel 300 enters into the inner ring-shaped channel 214 and flows in both the counterclockwise direction 364 and a clockwise direction 424. A portion of the fluid entering the inner ring-shaped channel 214 from the first cooling channel 300, such as about 50 percent, may leave the inner ring-shaped channel 214 in the first cooling channel 300 at node 324 while a second portion of the fluid may leave the inner ring-shaped channel 214 at a node 416 and flow into the second cooling channel 402. In yet another example, the fluid flowing in from the inlet 310 and through the first cooling channel 300 enters into the outer ring-shaped channel 212 and flows in both the clockwise direction 368 and a counterclockwise direction 468. A portion of the fluid entering the outer ring-shaped channel 212 from the third segment 315 of the first cooling channel 300, such as about 50 percent, may leave the outer ring-shaped channel 212 in the first cooling channel 300 at node 328 while a second portion of the fluid may leave the outer ring-shaped channel 212 at a node 440 and flow into the sixth cooling channel 410. In yet another embodiment, the cooling fluid flowing in from the inlet 310 and through the first cooling channel 300 enters into the inner ring-shaped channel 214 and flows in both the clockwise and counterclockwise direction 364, 424. A portion of the cooling fluid entering the inner ring-shaped channel 214 from the first cooling channel 300, such as about 50 percent of the cooling fluid from inlet 310, may leave the inner ring-shaped channel 214 at node 324 on the first cooling channel 300. The fluid flows into the outer ring-shaped channel 212 and flows in both the clockwise and counterclockwise direction 368, 468. A portion of the fluid entering the first cooling channel 300 from the inlet 310, such as about 25 percent of the cooling fluid that entered from inlet 310, may leave the outer ring-shaped channel 212 at node 328 in the first cooling channel 300. The quantity of the fluid flow from the inlet 310 and the outlet 380 may be substantially similar. Thus, the percent reduction in quantity of the original fluid flowing from the inlet 310 to the outlet 380 in the first cooling channel 300 is made up by fluid flowing in from adjacent cooling channels in both the inner ring-shaped channel 214 and the outer ring-shaped channel 212. For example, the cooling fluid exiting the first cooling channel 300 at the outlet 380 may contain cooling fluid which had entered into the cooling channels 210 in one of the other cooling channels 210 other than the first cooling channel 300, such as cooling fluid entering from the second and sixth cooling channels 402, 410.

The cooling base 130 may experience minor leakage between adjacent cooling channels 210 through the gap 255 formed between the lower surface 238 and the cap 232. The fraction of leakage between the cooling channels 210 in the cooling base 130 having six cooling channels 210 may be about less than 5 percent of the total flow rate of the cooling fluid flowing within the cooling base 130. The leakage of the cooling fluid between adjacent cooling channels 210 may be further reduced in alternate manufacturing techniques for the cooling base 130, such as by 3D printing.

The cooling channels 210 of the cooling base 130 improve the azimuthal temperature uniformity on substrates disposed on the substrate support 174. In particular, the cooling channels 210 reduce the cold regions on the substrate support 174 present between heater zones on conventional substrate support assemblies. Temperature non-uniformity can be additionally compensated by local increases in the thermal resistance provided by a circular thermal compensation channels in the cooling base 130. Such a schema increases the thermal resistance and can be made in the same way as the helium distribution backside gas channels. The thermal compensation channels are discussed in conjunction with FIG. 5.

Figure 5:
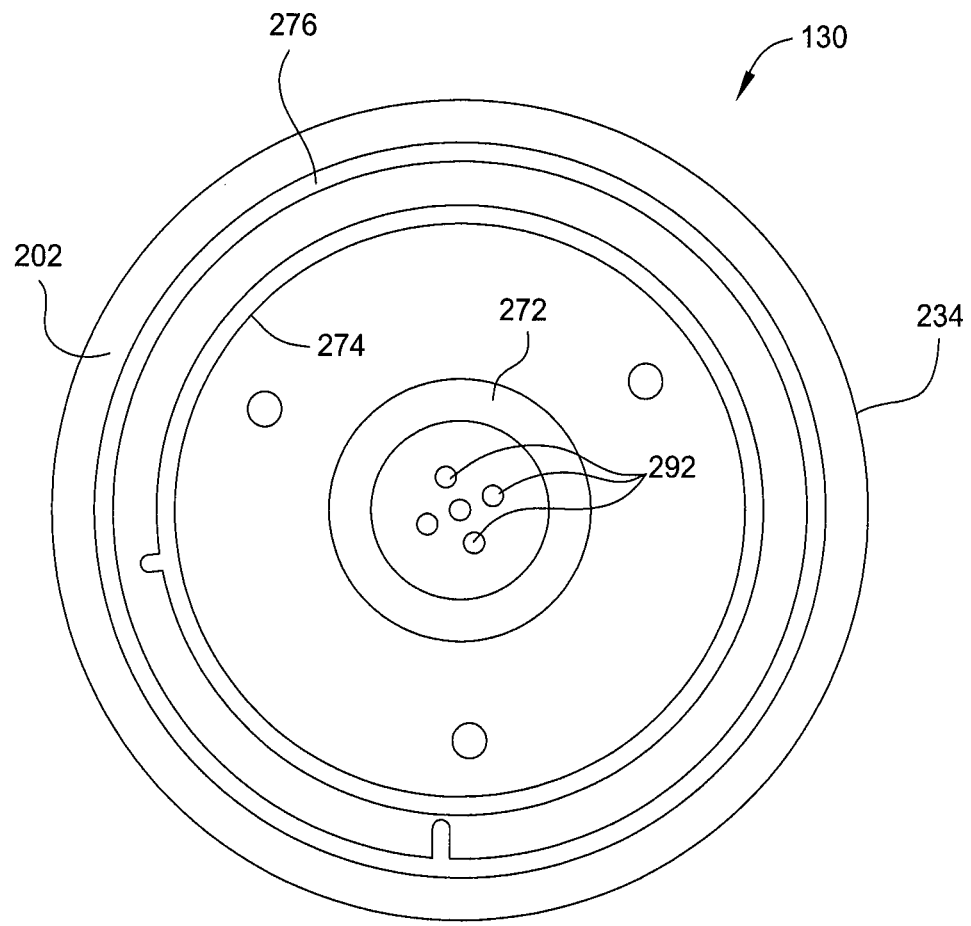
FIG. 5 is a top plan view of the cooling base depicting thermal compensation plenums.

FIG. 5 is a top plan view of the cooling base 130 depicting thermal compensation channel 272. The cooling base 130 may optionally have thermal compensation channels 272 formed in the top surface 202 of the cooling base 130 proximal the passageways 292. The cooling base 130 may additionally, or optionally, have one or more gas distribution channels 274, 276 formed in the top surface 202 of the cooling base 130 proximal the outer periphery 234. The thermal compensation channel 272, and gas distribution channels 274, 276 may be machined, etched, molded, formed in an additive manner, or fabricated by other suitable methods into the top surface 202 of the cooling base 130. A cooling fluid, such as a helium gas, deionized water, GALDEN® fluid, or other suitable heat transfer fluid may be circulated through the thermal compensation channel 272 for regulating the temperature near the passageways 292 at the center of the cooling base 130. Additionally, cooling fluid, such as helium, may optionally be circulated through the gas distribution channel 274 and/or gas distribution channel 276 for regulating the temperature near the outer periphery 234 of the cooling base 130.

The cooling channels of the cooling base 130, having the spiral shape, improve the temperature uniformity on substrates disposed on the substrate support 174. In particular, the cooling channels 210 help prevent cold regions from forming on the substrate support 174 between heater zones. The temperature non-uniformity at the center and outer periphery 234 can be compensated by local increase in the thermal resistance provided by the thermal compensation channel 272 and gas distribution channels 274, 276 in the cooling base 130.

Advantageously, the spiral cooling channels provide radial temperature symmetry. The cooling base with the spiral channels improves azimuthal temperature uniformity on the substrate. The circular thermal compensation channels in the cooling base additionally improve the radial temperature uniformity on the substrate. Advantageously, the high heat exchange coefficient of the cooling base 130 having the spiral cooling channels, such as cooling channels 210, and optionally the circular thermal compensation channel 272, and gas distribution channels 274, 276, provide a wider process window for processing conditions that subject the substrate disposed on the substrate support 174 to high plasma heat loads while undergoing plasma processing.

While the foregoing is directed to implementations of the present invention, other and further implementations of the invention may be devised without departing from the basic scope thereof, and the scope thereof is determined by the claims that follow.

What is claimed is:

1. A cooling base, comprising:
   a cap;
   a body having an outer periphery, a center portion, a top surface and a lower surface, wherein the cap is disposed on the lower surface of the body, the body further comprising:
      an inner ring-shaped channel and an outer ring-shaped channel; and
      a plurality of cooling channels disposed in the body and having at least a portion of each of the cooling channels in contact with the cap and formed in a polar array of spirals, wherein each cooling channel of the plurality of cooling channels comprises:
         an inlet and an outlet; and
         a plurality of channel segments which together form a fluid pathway between the inlet and the outlet, the fluid pathway extending from the inlet to the inner ring-shaped channel, from the inner ring-shaped channel out to the outer ring-shaped channel, and from the outer ring-shaped channel back towards the inner ring-shaped channel to the outlet, wherein the plurality of channel segments are configured for flowing a fluid therethrough.

2. The cooling base of claim 1, wherein the body further comprises:
   at least one thermal compensation plenum disposed on the top surface of the body, wherein the thermal compensation plenum is configured for a cooling fluid to flow therethrough.

3. The cooling base of claim 2, wherein the plurality of cooling channels comprises at least 4 cooling channels.

4. The cooling base of claim 1, wherein the plurality of channel segments comprise:
   a first segment extending from the inlet to the inner ring-shaped channel;
   a second segment extending along the inner ring-shaped channel and in fluid communication with the first segment;
   a third segment extending from the inner ring-shaped channel to the outer ring-shaped channel and in fluid communication with the second segment;
   a fourth segment extending along the outer ring-shaped channel and in fluid communication with the third segment; and
   a fifth segment extending from the outer ring-shaped channel to the outlet toward the inner ring-shaped channel and in fluid communication with the fourth segment.

5. The cooling base of claim 4, wherein the second segment is a part of the inner ring-shaped channel and the fourth segment is part of the outer ring-shaped channel.

6. The cooling base of claim 1, wherein the cooling channels are configured to allow a portion of the fluid flowing in through the inlet to a first cooling channel of the plurality of cooling channels exits the outlet of a second cooling channel of the plurality of cooling channels.

7. The cooling base of claim 1, wherein the plurality of cooling channels comprises at least 6 cooling channels.

8. The cooling base of claim 1 further comprising:
   an electrostatic chuck coupled to the body.

9. A substrate support assembly comprising:
   an electrostatic chuck having a heat, a workpiece support surface and a bottom surface;
   a cooling base, comprising:
      a cap;
      a body having an outer periphery, a center portion, a top surface and a lower surface, wherein the cap is disposed on the lower surface of the body, the body further comprising:
         an inner ring-shaped channel and an outer ring-shaped channel; and
         a plurality of cooling channels disposed in the body and having at least a portion of each of the cooling channels in contact with the cap and formed in a polar array of spirals, wherein each cooling channel of the plurality of cooling channels comprises:
            an inlet and an outlet; and
            a plurality of channel segments which together form a fluid pathway between the inlet and the outlet, the pathway extending from the inlet to the inner ring-shaped channel, from the inner ring-shaped channel out to the outer ring-shaped channel, and from the outer ring-shaped channel back towards the inner ring-shaped channel to the outlet, wherein the segments are configured for flowing a fluid therethrough.

10. The cooling base of claim 9, wherein the body further comprises:
    at least one thermal compensation plenum disposed on the top surface of the body, wherein the thermal compensation plenum is configured for a cooling fluid to flow therethrough.

11. The cooling base of claim 10, wherein the thermal compensation plenum further comprises:
    a first thermal compensation plenum disposed at the center portion; and
    a second thermal compensation plenum disposed at the outer periphery.

12. The cooling base of claim 10, wherein the plurality of cooling channels comprises at least 4 cooling channels.

13. The cooling base of claim 9, wherein the segments comprise:
- a first segment extending from the inlet to the inner ring-shaped channel;
- a second segment extending along the inner ring-shaped channel and in fluid communication with the first segment;
- a third segment extending from the inner ring-shaped channel to the outer ring-shaped channel and in fluid communication with the second segment;
- a fourth segment extending along the outer ring-shaped channel and in fluid communication with the third segment; and
- a fifth segment extending from the outer ring-shaped channel to the outlet toward the inner ring-shaped channel and in fluid communication with the fourth segment.

14. The cooling base of claim 13, wherein the second segment is a part of the inner ring-shaped channel and the fourth segment is part of the outer ring-shaped channel.

15. The cooling base of claim 9, wherein the plurality of cooling channels are configured to allow a portion of the fluid flowing in through the inlet to a first cooling channel of the plurality of cooling channels exits the outlet of a second cooling channel of the plurality of cooling channels.

16. The cooling base of claim 9, wherein the plurality of cooling channels further comprises at least 6 cooling channels.

17. The cooling base of claim 9, wherein the plurality of cooling channels are not connected to each other by the inner ring-shaped channel or the outer ring-shaped channel.

18. The cooling base of claim 9, wherein the segments comprise:
- a first segment extending from the inlet to the inner ring-shaped channel;
- a second segment extending along the inner ring-shaped channel and in fluid communication with the first segment, wherein the second segment is a part of the inner ring-shaped channel.

* * * * *

UNITED STATES PATENT AND TRADEMARK OFFICE
CERTIFICATE OF CORRECTION

PATENT NO. : 10,586,718 B2  
APPLICATION NO. : 15/335059  
DATED : March 10, 2020  
INVENTOR(S) : Knyazik et al.

Page 1 of 1

It is certified that error appears in the above-identified patent and that said Letters Patent is hereby corrected as shown below:

In the Claims

In Column 12, Line 56, Claim 10, after "The" and before "of claim 9," delete "cooling base," and add "substrate support assembly."

In Column 12, Line 62, Claim 11, after "The" and before "of claim 10," delete "cooling base," and add "substrate support assembly."

In Column 13, Line 1, Claim 12, after "The" and before "of claim 10," delete "cooling base," and add "substrate support assembly."

In Column 13, Line 3, Claim 13, after "The" and before "of claim 9," delete "cooling base," and add "substrate support assembly."

In Column 13, Line 19, Claim 14, after "The" and before "of claim 13," delete "cooling base," and add "substrate support assembly."

In Column 14, Line 1, Claim 15, after "The" and before "of claim 9," delete "cooling base," and add "substrate support assembly."

In Column 14, Line 6, Claim 16, after "The" and before "of claim 9," delete "cooling base," and add "substrate support assembly."

In Column 14, Line 9, Claim 17, after "The" and before "of claim 9," delete "cooling base," and add "substrate support assembly."

In Column 14, Line 13, Claim 18, after "The" and before "of claim 9," delete "cooling base," and add "substrate support assembly."

Signed and Sealed this  
Eighth Day of September, 2020

Andrei Iancu  
*Director of the United States Patent and Trademark Office*